United States Patent
Crocker (10) Patent No.: US 6,207,026 B1
(45) Date of Patent: Mar. 27, 2001

(54) MAGNETRON WITH COOLING SYSTEM FOR SUBSTRATE PROCESSING SYSTEM

(75) Inventor: Steven Charles Crocker, Sunnyvale, CA (US)

(73) Assignee: Applied Materials, Inc., Santa Clara, CA (US)

(*) Notice: Subject to any disclaimer, the term of this patent is extended or adjusted under 35 U.S.C. 154(b) by 0 days.

(21) Appl. No.: 09/418,511

(22) Filed: Oct. 13, 1999

(51) Int. Cl.⁷ .................... C23C 14/00; C23C 14/32; C23C 16/00; C23F 1/02
(52) U.S. Cl. .................. 204/192.12; 204/298.2; 204/298.16; 204/298.17; 204/298.25; 204/298.09; 118/724; 156/345
(58) Field of Search .................... 204/298.2, 298.16, 204/298.17, 298.25, 298.09; 118/724; 156/345

(56) References Cited

U.S. PATENT DOCUMENTS

| | | | |
|---|---|---|---|
| 4,100,055 | 7/1978 | Rainey | 204/298 |
| 4,166,018 | 8/1979 | Chapin | 204/192 R |
| 4,637,146 | 1/1987 | Motoki et al. | 34/58 |
| 4,651,440 | 3/1987 | Karl | 34/58 |
| 4,680,061 | 7/1987 | Lamont, Jr. | 148/1.5 |
| 4,746,417 | 5/1988 | Ferenbach et al. | 204/298 |
| 4,936,940 | 6/1990 | Kawasumi et al. | 156/345 |
| 4,989,345 | 2/1991 | Gill, Jr. | 34/58 |
| 5,096,562 | 3/1992 | Boozenny et al. | 204/298.22 |
| 5,100,527 | 3/1992 | Stevenson et al. | 204/298.22 |
| 5,171,415 | 12/1992 | Miller et al. | 204/298.09 |
| 5,567,289 | 10/1996 | Taylor et al. | 204/298.11 |
| 5,591,314 | 1/1997 | Morgan et al. | 204/298.22 |
| 5,628,889 * | 5/1997 | Gardell et al. | 204/298.09 |
| 5,643,427 * | 7/1997 | Kobayashi et al. | 204/298.2 |
| 5,702,573 | 12/1997 | Biberger et al. | 204/192.12 |

OTHER PUBLICATIONS

U.S. application No. 09/057,254, Mandrekar et al. filed Apr. 8, 1998.

U.S. application No. 09/030,264, Fu et al. filed Feb. 25, 1998.

\* cited by examiner

*Primary Examiner*—Nam Nguyen
*Assistant Examiner*—Daborah Chacko-Davis
(74) *Attorney, Agent, or Firm*—Thomason, Moser & Patterson, LLP (57) ABSTRACT

The present invention generally provides a vacuum processing system with a process chamber and a rotating member, such as a magnetron in a PVD chamber, disposed in a cooling cavity of the process chamber, where the rotating member includes a deflection member for deflecting cooling fluid in the cooling cavity toward interior portions of the rotating member. In one embodiment, a base plate of the rotating member defines an upper surface of the rotating member and a magnet retainer defines a lower surface of the rotating member. Magnets are mounted between the base plate and the magnet retainer. The deflection member is mounted between the magnets and can be coupled to the magnets on one or both ends. One end of the deflection member is disposed toward the outer perimeter of the magnetron and the other end of the deflection member is disposed toward the interior portions of the rotating member. As the rotating member rotates, the deflection member deflects the cooling fluid from the side of the rotating member and forces the fluid into the interior portions of the rotating member. Heated fluid and/or air pockets in the interior portions are at least partially displaced by cooler fluid forced into the interior portions of the rotating member. A flow of cooling fluid provides cool fluid coming into the cooling cavity while heated fluid exits the cooling cavity.

27 Claims, 5 Drawing Sheets

MAGNETRON WITH COOLING SYSTEM FOR SUBSTRATE PROCESSING SYSTEM

BACKGROUND OF THE INVENTION

1. Field of the Invention

The present invention generally relates to methods and apparatuses used in vacuum processing systems used to fabricate integrated circuits, flat panel displays, and other electronic devices. More specifically, the present invention relates to methods and apparatuses for cooling a rotating element in or about a process chamber of a substrate processing system.

2. Background of the Related Art

The processes for fabricating ICs or other structures on a substrate typically involve operating in a vacuum environment in a process chamber. The process chambers include, among others, physical vapor deposition (PVD) chambers, chemical vapor deposition (CVD) chambers, rapid thermal processing (RTP) chambers, and etch chambers. Some of these processes involve generating an ionized plasma discharge in a region of the chamber near the substrate to generate ions which strike a target to dislodge target material, which then travel onto the surface of the substrate, thereby depositing a thin film of the target material on the substrate.

Plasma discharges are typically formed in the process chamber by DC or RF voltages, microwaves, planar magnetrons, or a combination of techniques. A planar magnetron system uses a rotating magnetron disposed above a target and either a DC bias between the target and the substrate and/or an RF source coupled into the space between the target and substrate to form the plasma. The magnetron is a magnet assembly that provides magnetic field lines near the sputtering surface of the target. A negative bias voltage between the target and the plasma region accelerates the ions toward the target to dislodge the target material therefrom. The magnetic field from the magnetron confines the free electrons, including secondary electrons displaced from the target material, near the target to maximize the ionizing collisions by the free electrons with the sputtered material. The magnetron typically includes one or more magnets, which rotate around the backside, i.e., non-sputtered surface, of the target to evenly spread the magnetic field around the surface of the target to result in more uniform sputtering of the target material.

Figure 1:
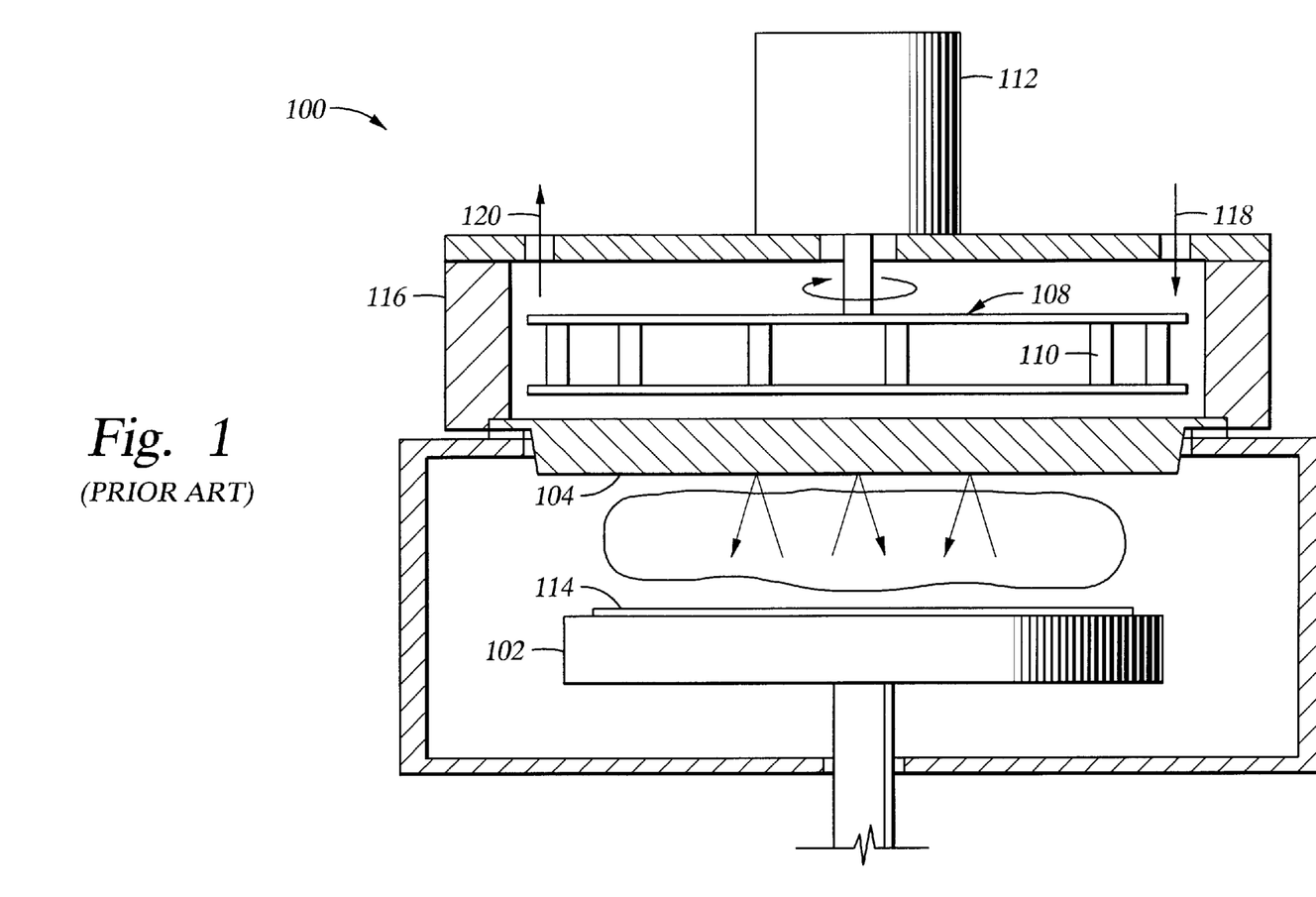
FIG. 1 is a schematic side view of a typical process chamber.

FIG. 1 is a schematic side view of a PVD chamber 100. Generally, the PVD chamber 100 comprises a substrate support member 102, a target 104, a cooling cavity 116 and a magnetron 108 disposed therein. A cooling fluid, such as deionized water or antifreeze, flows through the cooling cavity 116 to cool the target 104 and the magnetron 108. The magnetron 108 has a magnet assembly including several magnets 110 mounted thereon. A motor assembly 112 provides rotational motion to the magnetron 108. The plasma is struck in the space between the wafer 114 and the target 104 and ions in the plasma strike the target 104.

The process may heat up the target 104 and the magnetron 108 to about 110° C.–120° C. and about 130° C.–140° C., respectively, in the cooling cavity even with the cooling fluid. If the magnetron 108 and/or the target 104 are heated above a designated process temperature, then the high temperature may alter the performance of the process by changing the sputtering rate or sputtering uniformity on the target and lessening the useful lives of the magnetron 108 and the target 104. Additionally, the excessive heat may cause thermal expansion of the members and cause interference between closely spaced members, such as the target 104 and magnetron 108. The excessive heat may also cause mechanical features of the magnetron 108 to wear out prematurely.

The rotational motion of the magnetron 108 creates a centrifugal force that pulls the cooling fluid away from the rotational center of the magnetron 108 and toward its outer edge. The centrifugal force caused by the rotating magnetron 108 combined with the heat generated at the magnetron's rotational center causes vapor bubbles to form near the rotational center of the magnetron 108, an effect known as cavitation. Additionally, bubbles are formed in the fluid as the fluid is circulated through a heat exchanger (not shown) and then back to the cooling cavity. The bubbles can cause an air pocket to form near the rotational center, reducing circulation. The reduced circulation results in poor cooling near the rotational center of the magnetron. The vapor bubbles also cause an abrasive action on the magnets 110 and cause the magnets 110 to wear.

Others have sought to remedy the problem of poor circulation in the interior portions of the magnetron by creating a low pressure area in the interior portions of the magnetron to induce a cooling fluid flow though the interior portions of the magnetron and promote better circulation, such as in co-pending U.S. application Ser. No. 08/964,949, titled "Magnetron With Cooling System For Process Chamber Of Processing System", filed Nov. 5, 1997. While the induced flow assists in promoting better circulation, the induced flow does not provide a positive forced circulation within the internal portions of the magnetron.

Therefore, a need exists for a mechanism to enhance the flow of cooling fluid through the interior portions of a rotating member, such as a magnetron, in a processing system, such as a PVD chamber.

SUMMARY OF THE INVENTION

The present invention generally provides a vacuum processing system with a process chamber and a rotating member, such as a magnetron in a PVD chamber, disposed in a cooling cavity of the process chamber containing a cooling fluid, such as water, that circulates into and out of the cooling cavity. A deflection member, such as a blade deflection member, is disposed between a lower surface of the rotating member and an upper surface of the rotating member radially toward interior portions of the rotating member. The deflection member in conjunction with the rotational motion of the rotating member causes the cooling fluid to be forced into the interior portions of the rotating member from the outside perimeter of the rotating member, thereby circulating the cooling fluid through the rotating member.

In one aspect, the invention provides a process chamber, comprising a cooling cavity, a rotating member disposed at least partially in the cooling cavity, having an upper first surface and a lower second surface, a motor coupled to the rotating member, and at least one deflection member disposed between the upper first surface and the lower second surface.

In another aspect, the invention provides a magnetron for use in a process chamber, comprising an tipper first surface, a lower second surface, a rotational axis for receiving a rotational motion, and at least one deflection member disposed between the upper first surface and the lower second surface.

In another aspect, the invention provides a vacuum processing system, comprising a process chamber having a cooling cavity, a transfer chamber cooperatively engaged with the process chamber, a rotating member disposed within the cooling cavity, the rotating member having an upper first surface and a lower second surface, a motor device for imparting a rotational motion to the rotating member, and at least one deflection member disposed between the upper first surface and the lower second surface.

In another aspect, the invention provides a method for cooling a rotating member of a process chamber, comprising imparting a rotational motion to the rotating member, providing a cooling fluid around an outer surface of the rotating member, and deflecting at least a portion of the cooling fluid from an outer perimeter of the rotating member to an interior portion of the rotating member between an upper first surface and a lower second surface of the rotating member.

BRIEF DESCRIPTION OF THE DRAWINGS

So that the manner in which the above recited features, advantages and objects of the present invention are attained and can be understood in detail, a more particular description of the invention, briefly summarized above, may be had by reference to the embodiments thereof which are illustrated in the appended drawings.

It is to be noted, however, that the appended drawings illustrate only typical embodiments of this invention and are therefore not to be considered limiting of its scope, for the invention may admit to other equally effective embodiments.

DETAILED DESCRIPTION OF THE PREFERRED EMBODIMENT

Figure 2:
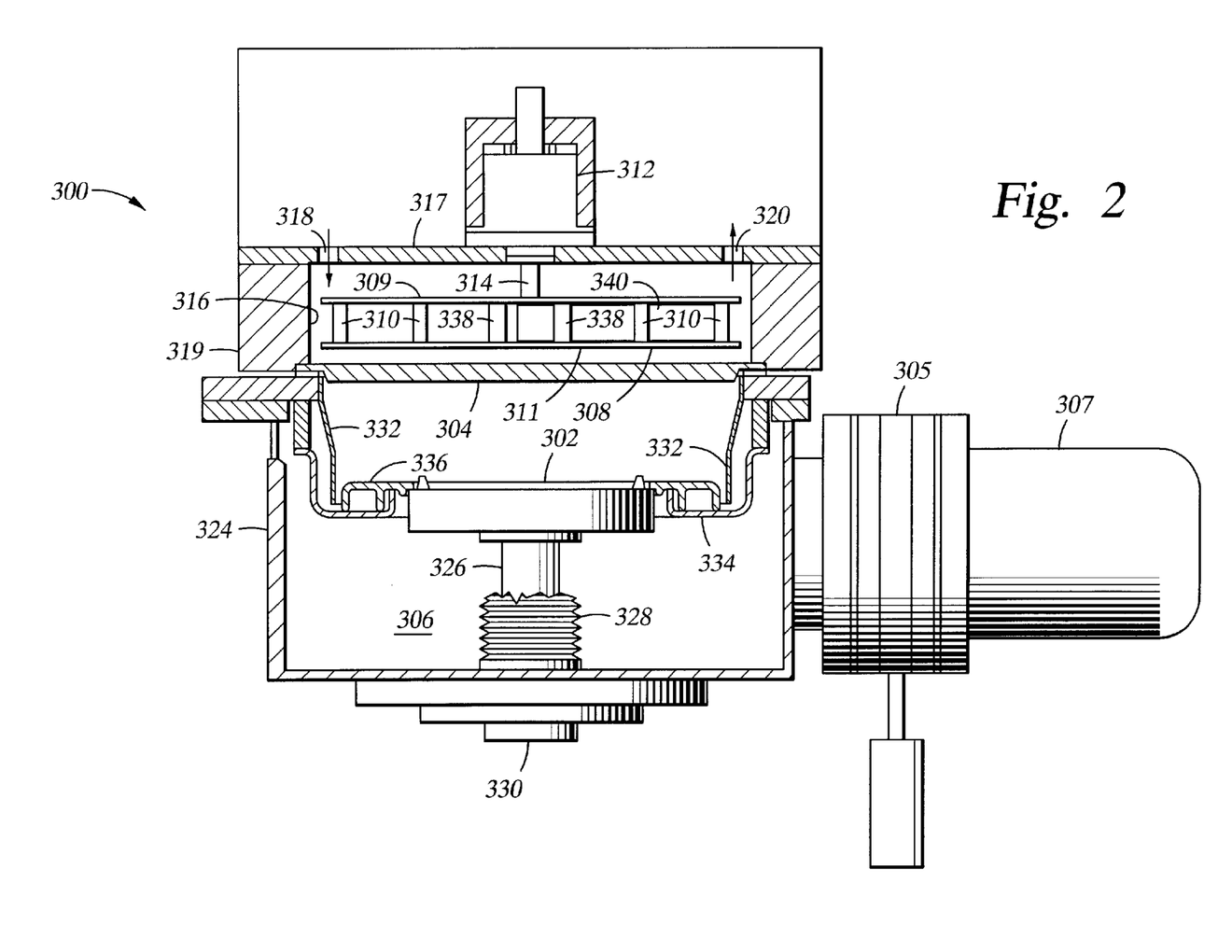
FIG. 2 is a schematic side view of a process chamber according to the present invention.

FIG. 2 is a schematic side view of a PVD chamber 300. The PVD chamber 300 generally includes a chamber section 306 and a pump section 307. While a magnetron and cooling system will be described with reference to a process chamber having the configuration of the PVD chamber 300, it is understood that the invention can be used to advantage with any type of process chamber and may be configured with the substrate support member and process environment above, to the side, or below the target. Thus, any indications of up, down or other directions are only references and not meant to limit the invention.

The PVD chamber 300 includes a substrate support member 302, a target 304 disposed above the substrate support member, a cooling cavity 316 disposed above the target, and a magnetron 308 disposed in the cooling cavity. The substrate support member 302, also known as a susceptor or heater, is disposed within the chamber for receiving a substrate. The substrate support member 302 may heat the substrate if required by the process being performed. A target 304 is disposed in the top of the chamber section 306 to provide material, such as aluminum, copper, titanium or tungsten and corresponding nitrides, to be sputtered onto the substrate.

The cooling cavity 316 is situated above the chamber section 306 and sealed from the processing region of the chamber. The cooling cavity 316 is defined by a top 317, sides 319 and a target 304. A cooling fluid, such as water or antifreeze, is flowed into the cooling cavity 316 through inlet 318 and out of the cooling cavity 316 through outlet 320, at a rate of about one gallon per minute (gpm) to about ten gpm, preferably about three gpm. The cooling fluid is circulated through a heat exchanger (not shown) to remove heat from the fluid and then recirculated to the cooling cavity 316.

A rotating magnetron 308 is disposed in the cooling cavity 316 on the backside of the target 304 and the cooling cavity is filled with the cooling fluid. The magnetron 308 can have a variety of shapes depending on the material to be deposited and the process conditions and may be asymmetrical about a rotational center 348. The magnetron 308 has a set of magnets 310 arranged within the magnetron 308 so that they create magnetic field lines spinning across the sputtering surface of the target as the magnetron is rotated. The magnets 310 are secured between an upwardly disposed base plate 309 defining a first surface of the magnetron 308 and a downwardly disposed magnet retainer 311 defining a second surface. The magnetron 308 is situated above the top side of the target 304 with about a one millimeter to about five millimeter, preferably about two millimeter to about three millimeter, gap therebetween. A motor assembly 312 for rotating the magnetron 308 is mounted to the top 317 of the cooling cavity 316. A shaft 314, which mechanically couples the motor assembly 312 to the rotational center of the base plate 309 of the magnetron 308, extends through the top 317, and is sealed from the cooling fluid in the cooling cavity 316. The motor assembly 312 imparts a rotational motion to the magnetron 308 to cause it to spin from about 80 revolutions per minute (rpm) to about 200 rpm and preferably about 100 rpm during performance of the process.

FIG. 2 also shows a lift mechanism, including a guide rod 326, a bellows 328 and a lift actuator 330 mounted to the bottom of the chamber section 306, which raises the substrate support member 302 to the target 304 for the PVD chamber 300 to perform the process and lowers the substrate support member 302 to exchange substrates. A set of shields 332, 334, 336, disposed within the chamber section 306, surround the substrate support member 302 and the substrate during processing in order to prevent the target material from depositing on the edge of the substrate and on other surfaces inside the chamber section 306. A negative DC bias voltage of about 200 V or more is typically applied to the target 304, and a ground is applied to an anode, the substrate support member 302, and the chamber surfaces. The combined action of the DC bias and the rotating magnetron 308 generate an ionized plasma discharge in a process gas, such as argon, between the target 304 and the substrate. The positively charged ions are attracted to the target 304 and strike the target 304 with sufficient energy to dislodge atoms of the target material, which sputters onto the substrate.

The pump section 307 typically includes a cryogenic pump, or other high vacuum pump, for pumping the chamber section 306 to a very high vacuum, so the chamber section 306 may process a substrate. A gate valve 305 is disposed between the chamber section 306 and the pump section 307 to provide access therebetween so the pump section 307 can reduce the pressure in the chamber section 306 and to provide isolation therebetween so the chamber section 306 may be vented.

A deflection member 340 is preferably disposed between the base plate 309 and the magnet retainer 311. The deflection member extends from about the outer perimeter of the magnetron to the interior portions of the magnetron 308. Generally, as the magnetron rotates, the deflection member urges cooling fluid toward the interior portions of the magnetron 308, as described in detail in reference to FIG. 3.

Figure 3:
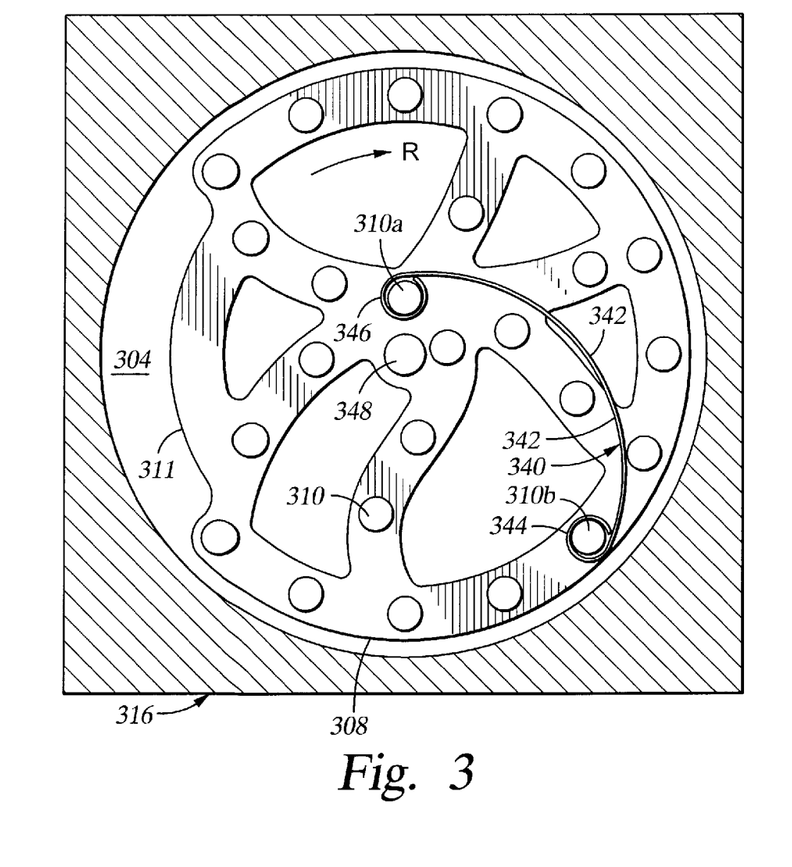
FIG. 3 is a schematic top view of the deflection member mounted between the upper and lower surfaces of the rotating member.

FIG. 3 is a schematic top view of the deflection member 340 mounted in the magnetron 308 with the upwardly disposed base plate 309 removed for clarity. The magnetron 308 rotates within the cooling cavity 316 in the direction of arrow R about a rotational center 348. The magnets 310 can be disposed in a variety of patterns and one exemplary pattern is shown. The magnet retainer 311 is typically connected to the base plate 309 (shown in FIG. 2) by threaded fasteners (not shown) and the magnets 310 are disposed therebetween. A deflection member 340 is disposed between the magnets and forms a curved surface which directs the cooling fluid toward the interior portions of the magnetron 308. The deflection member 340 can include a central portion 342 and two ends 344, 346. The end 344 forms a leading edge disposed in a forward rotational direction adjacent an outer perimeter of the magnetron 308. In one embodiment, the two ends are used to couple the deflection member 340 to the magnetron 308. For example, the two ends can be cylindrically shaped to at least partially surround one or more magnets 310a, 310b. Alternatively, the deflection member 340 could be coupled to the magnetron 308 by threaded fasteners, welding, adhesives, or any other attachment method that is compatible with the fluid and process conditions. The deflection member 340 is preferably made of a corrosion resistant material such as stainless steel, plated steel, or other corrosion resistant materials that can operate at temperatures up to about 600° C. The interior end 346 of the deflection member 340 is preferably disposed near the rotation center 348 to direct the fluid toward the center. Alternatively, the deflection member could be disposed at other locations in the interior portions of the magnetron, depending on the locations at which fluid flow would be directed. Also, the deflection member could extend beyond the outer perimeter of the base plate 309 to further increase the volume of cooling fluid directed toward the interior portions.

Figure 4:
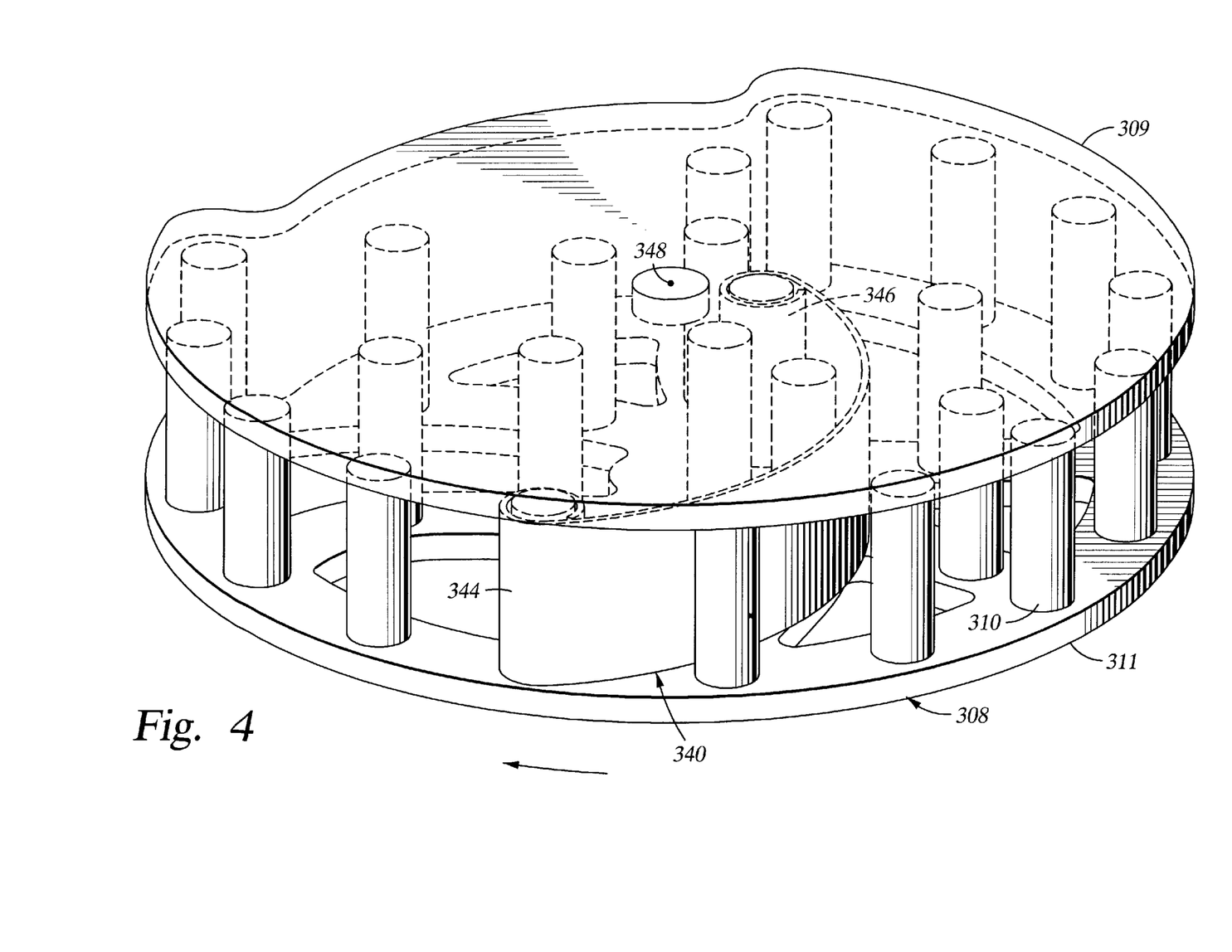
FIG. 4 is a perspective view of the rotating member shown in FIG. 3.

FIG. 4 is a perspective view of the rotating member. The base plate 309 defines an upper surface of the rotating member, such as a magnetron, and the magnet retainer 311 defines a lower surface of the rotating member. Magnets 310 are mounted between the base plate 309 and the magnet retainer 311. The deflection member 340 is mounted between the magnets and can be coupled to the magnets on one or both ends 344, 346. One end 344 of the deflection member is disposed toward the outer perimeter of the magnetron 308 and the other end 346 of the deflection member is disposed toward the axis of rotation 348 toward the interior portions of the magnetron 308.

Figure 5:
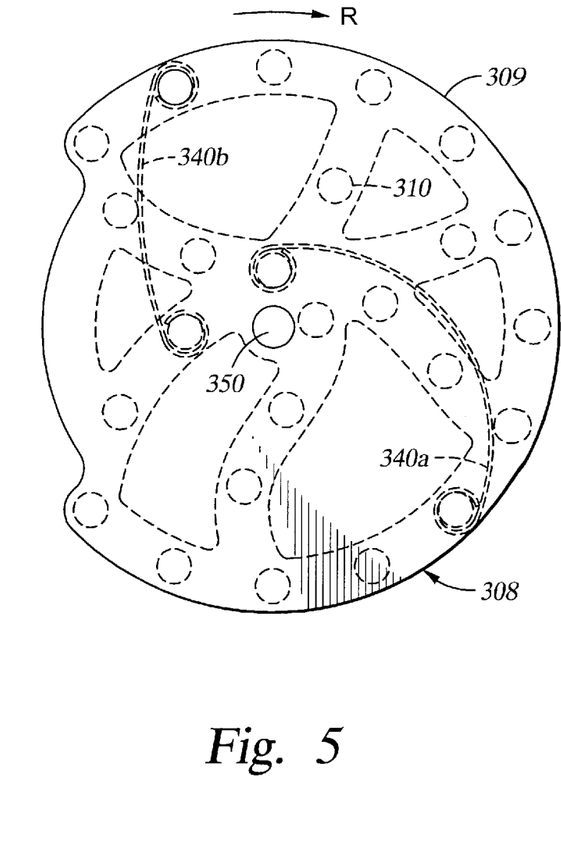
FIG. 5 is a schematic top view of another embodiment of the rotating member.

FIG. 5 is a schematic top view of another embodiment of a magnetron 308 having two deflection members 340a, 340b. While two deflection members are shown, additional deflection members could be used to achieve the desired fluid flow. Also, the base plate 309 can have an opening 350 that communicates from the interior portions of the magnetron to the external surface of the base plate. Fluid directed toward the interior portions of the magnetron 308 can at least partially flow through the opening 350 to provide additional flow paths for the cooling fluid. It is believed that the opening 350 can provide increased circulation toward the center by allowing the fluid to discharge from the interior portions through the base plate 309, especially when using more than one deflection member. Other openings can be disposed through the base plate as needed. Also, the deflection member is shown with preferably a curved shape. However, other shapes could be used so that the cooling fluid is directed toward the interior portions of the magnetron as desired.

In operation, referring to FIGS. 2–5, during rotation of the magnetron 308, the cooling fluid flows around and partially between portions of the magnetron 308. As the magnetron rotates, the rotation induces momentum in the fluid which forces the fluid to the outer perimeter, and away from the center, of the magnetron 308. However, the deflection member(s) 340 deflects the cooling fluid from the side of the magnetron 308 and forces the fluid into the interior portions of the magnetron. Preferably, the fluid is evenly distributed throughout the magnetron 308 and particularly in the center of the magnetron. Heated fluid and/or air pockets in the interior portions are at least partially displaced by cooler fluid forced towards the interior portions of the magnetron 308. A flow of water provides cool water coming into the cooling cavity 316 through the inlet 318 while heated water exits the cooling cavity 316 through outlet 320.

The deflection member 340 could be used in conjunction with other efforts directed at solving the cooling of the magnetron. For instance, the deflection member could push cooling fluid toward the interior portions of the magnetron 308 and the cooling fluid could be induced out through the opening 350 by the system disclosed in U.S. application Ser. No. 08/964,949 discussed herein.

Figure 6:
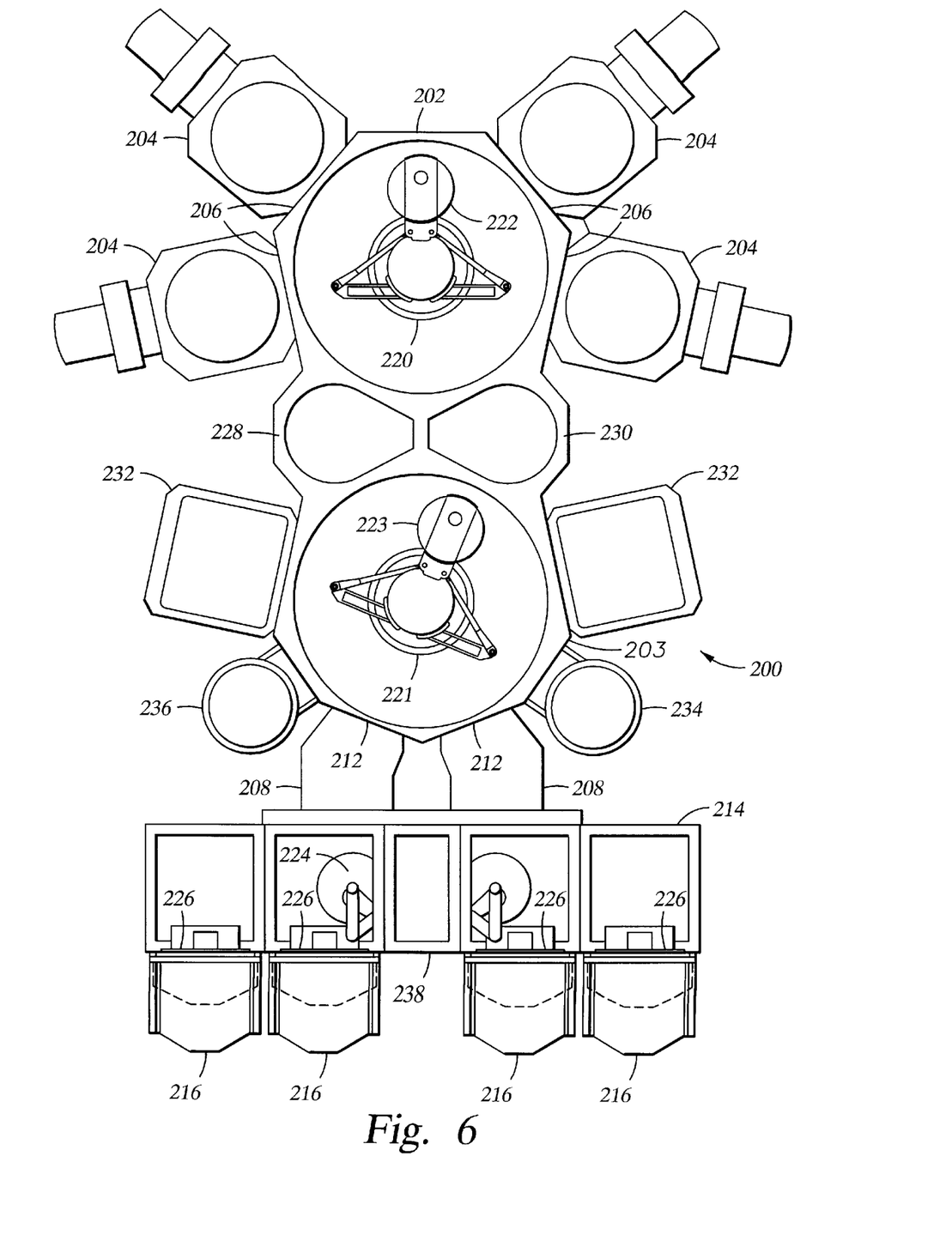
FIG. 6 is a schematic top view of a vacuum processing system.

The System:

A vacuum processing system for substrates, typically wafers, that incorporates the above described invention will now be described. FIG. 6 generally shows a schematic top view of an embodiment of a vacuum processing system 200. The system 200 shown in FIG. 6 is an example of the Endura® system available from Applied Materials, Inc. of Santa Clara, Calif. While the invention may be practiced with the system 200, it is understood that other types of vacuum processing systems may be used to advantage with a variety of vacuum processing systems. The vacuum processing system 200 includes a buffer chamber 203 and a transfer chamber 202 typically mounted on a platform (not shown) and generally forming a system monolith. The system monolith has two load lock chambers 208 mounted at facets 212. A mini-environment 214 optionally attaches to the load lock chambers 208. The transfer chamber 202 has four process chambers 204 mounted at facets 206. The process chambers 204 perform the primary wafer process on the wafers in the vacuum processing system 200. Process chambers 204 may be any type of process chamber, such as a PVD chamber, a CVD chamber, an RTP chamber, an etch chamber, and other chambers.

The PVD chamber 300 (FIG. 2) attaches to a transfer chamber 202 at a slit valve opening (not shown) in side 324. The slit valve opening provides access for the transfer chamber robot 220 to insert or remove a wafer (not shown) into or from the chamber section 306. The process chamber 204 can have a cooled rotating member, such as the magnetron described herein, disposed near a surface, such as the top side of a target in the PVD chamber.

The process chambers 204 are supported by the transfer chamber 202 or can be supported on process chamber platforms, depending on the configuration of the individual process chambers 204. Slit valves (not shown) in the facets 206 provide access and isolation between the transfer chamber 202 and the process chambers 204. Correspondingly, the process chambers 204 have openings (not shown) on their surfaces that align with the slit valves.

A pre-clean chamber 228 and a cool-down chamber 230 are disposed between the transfer chamber 202 and the buffer chamber 203. The pre-clean chamber 228 cleans the wafers before entering the transfer chamber 202, and the cool-down chamber 230 cools the wafers after processing in the process chambers 204. The pre-clean chamber 228 and the cool-down chamber 230 also transition the wafers between the vacuum levels of the transfer chamber 202 and the buffer chamber 203. The buffer chamber 203 has two expansion chambers 232 for performing additional processes on the wafers. The buffer chamber 203 further has a cool-down chamber 234 for further cooling the wafers, if necessary. Other chambers, such as a wafer orienter chamber or an additional pre-processing or post-processing chamber, can be mounted on the buffer chamber 203.

The load lock chambers 208 transition one wafer at a time between the ambient environment pressure to the buffer chamber vacuum pressure. Openings (not shown) in facets 212 provide access and valves provide isolation between the load lock chambers 208 and the buffer chamber 203. Correspondingly, the load lock chambers 208 have openings that align with the openings in facets 212. The load lock chambers 208 and the mini-environment 214 have corresponding openings (not shown) providing access therebetween, while doors (not shown) for the openings provide isolation.

Prior to the introduction of 300-mm wafers in the semiconductor processing industry, cassettes of wafers were typically loaded by human operators directly into the load lock chambers 208. Thus, a mini-environment 214 was not present in the system 200. More recently, semiconductor fabrication facilities include a mini-environment 214 to enter the wafers into the processing system 200 from cassettes of wafers transported by a factory automation handling system. The present invention contemplates incorporation in both types of systems 200.

The mini-environment 214 has four pod loaders 216 attached on its front side 238 for receiving wafer cassettes from the factory automation. Openings (not shown) with corresponding doors 226 provide access and isolation between the mini-environment 214 and the pod loaders 216. The pod loaders 216 are mounted on the side of the mini-environment 214 and are essentially shelves for supporting the wafer cassettes (not shown) used to transport the wafers to and from the vacuum processing system 200.

A robot 220, or wafer handler, is disposed within the transfer chamber 202 for transferring a wafer 222 between the pre-clean chamber 228 and the cool-down chamber 230 and the process chambers 204. A similar robot 221 is disposed within the buffer chamber 203 for transferring a wafer 223 between the load lock chambers 208, the expansion chambers 232, the cool-down chamber 234, the additional chamber 236, the pre-clean chamber 228 and the cool-down chamber 230. Likewise, a robot 224 is disposed within the mini-environment 214 for transferring the wafers between the pod loaders 216 and the load lock chambers 208. The robot 224 is typically mounted on a track so the robot 224 can move back and forth in the mini-environment 214.

While the foregoing is directed to the preferred embodiment of the present invention, other and further embodiments of the invention may be devised without departing from the basic scope thereof, and the scope thereof is determined by the claims which follow.

What is claimed is:

1. A cooling system coupled to a process chamber, comprising:
   a) a cooling cavity;
   b) a rotating member disposed at least partially in the cooling cavity, having an upper first surface, a lower second surface, and at least two or more magnet pieces disposed at least partially between the upper first surface and the lower second surface;
   c) a motor coupled to the rotating member; and
   d) at least one deflection member disposed between the upper first surface and the lower second surface and between at least two magnet pieces.

2. The cooling system of claim 1, wherein the deflection member is disposed between an outer perimeter of the rotating member and an interior portion of the rotating member.

3. The cooling system of claim 2, further comprising cooling fluid disposed in the cooling cavity and wherein a portion of the cooling fluid is forced from an outer perimeter of the rotating member to an interior portion of the rotating member by the deflection member.

4. The cooling system of claim 1, wherein the deflection member comprises at least one curved portion.

5. The cooling system of claim 1, wherein the deflection member comprises an end that forms a leading edge disposed in a forward rotational direction adjacent an outer perimeter of the rotating member.

6. The cooling system of claim 1, wherein the deflection member comprises at least one end coupled to a magnet.

7. A magnetron for use in a process chamber, comprising:
   a) an upper first surface;
   b) a lower second surface;
   c) at least two or more magnet pieces disposed between the upper first surface and the lower second surface;
   d) a shaft coupled to the upper first surface and the lower second surface for receiving a rotational motion; and
   e) at least one deflection member disposed between the upper first surface and the lower second surface and between at least two magnet pieces.

8. The magnetron of claim 7, wherein the deflection member is disposed radially inward from an outer perimeter of the magnetron.

9. The magnetron of claim 7, wherein the deflection member comprises an end that forms a leading edge disposed in a forward rotational direction adjacent an outer perimeter of the rotating member.

10. The magnetron of claim 7, wherein the deflection member comprises at least one curved portion.

11. The magnetron of claim 7, wherein the deflection member comprises at least one end coupled to a magnet.

12. A vacuum processing system, comprising:
   a) a transfer chamber;
   b) a process chamber cooperatively engaged with the transfer chamber, the process chamber having a cooling system, comprising:
      i) a cooling cavity;
      ii) a rotating member, capable of a rotational motion, disposed within the cooling cavity, the rotating member having an upper first surface, a lower second surface, and at least two or more magnet pieces;
      iii) a motor device for imparting a rotational motion to the rotating member; and
      iv) at least one deflection member disposed between the upper first surface and the lower second surface and between at least two magnet pieces.

13. The vacuum processing system of claim 12, wherein the process chamber comprises a PVD chamber and the rotating member comprises a magnetron.

14. The vacuum processing system of claim 12, wherein the deflection member comprises at least one curved portion.

15. The vacuum processing system of claim 12, wherein the deflection member is disposed between an outer perimeter of the rotating member and an interior portion of the rotating member.

16. The vacuum processing system of claim 12, wherein the deflection member comprises an end that forms a leading edge disposed in a forward rotational direction adjacent an outer perimeter of the rotating member.

17. The vacuum processing system of claim 12, further comprising cooling fluid disposed in the cooling cavity and wherein a portion of the cooling fluid is forced from an outer perimeter to an interior portion of the rotating member by the deflection member.

18. The vacuum processing system of claim 12, wherein the deflection member comprises at least one end coupled to a magnet in the rotating member.

19. A method for cooling a rotating member of a process chamber, comprising:
   a) imparting a rotational motion to the rotating member;
   b) providing a cooling fluid around an outer surface of the rotating member; and
   c) using a deflection member disposed between an outer perimeter of the rotating member and an interior portion of the rotating member and between at least two magnet pieces to deflect at least a portion of the cooling fluid from an outer perimeter of the rotating member to an interior portion of the rotating member between an upper first surface and a lower second surface of the rotating member.

20. A process chamber, comprising:
   a) a cooling cavity;
   b) a rotating member disposed at least partially in the cooling cavity, having an upper first surface and a lower second surface;
   c) a motor coupled to the rotating member;
   d) at least one deflection member disposed between the upper first surface and the lower second surface; and
   e) at least one deflection member disposed between an outer perimeter of the rotating member and an interior portion of the rotating member.

21. The process chamber of claim 20, further comprising cooling fluid disposed in the cooling cavity and wherein a portion of the cooling fluid is forced from an outer perimeter of the rotating member to an interior portion of the rotating member by the deflection member.

22. A process chamber, comprising:
   a) a cooling cavity;
   b) a rotating member disposed at least partially in the cooling cavity, having an upper first surface and a lower second surface;
   c) a motor coupled to the rotating member; and
   d) at least one deflection member comprising an end that forms a leading edge disposed in a forward rotational direction adjacent an outer perimeter of the rotating member, wherein the deflection member is disposed between the upper first surface and the lower second surface.

23. A magnetron for use in a process chamber, comprising:
   a) an upper first surface;
   b) a lower second surface;
   c) a rotational axis for receiving a rotational motion; and
   d) at least one deflection member disposed between the upper first surface and the lower second surface and radially inward from an outer perimeter of the magnetron.

24. A magnetron for use in a process chamber, comprising:
   a) an upper first surface;
   b) a lower second surface;
   c) a rotational axis for receiving a rotational motion; and
   d) at least one deflection member comprising an end that forms a leading edge disposed in a forward rotational direction adjacent an outer perimeter of the rotating member, wherein the deflection member is disposed between the upper first surface and the lower second surface.

25. A vacuum processing system, comprising:
   a) a process chamber having a cooling cavity;
   b) a transfer chamber cooperatively engaged with the process chamber;
   c) a rotating member, capable of a rotational motion, disposed within the cooling cavity, the rotating member having an upper first surface and a lower second surface;
   d) a motor device for imparting a rotational motion to the rotating member;
   e) at least one deflection member disposed between the upper first surface and the lower second surface; and
   f) at least one deflection member disposed between an outer perimeter of the rotating member and an interior portion of the rotating member.

26. A vacuum processing system, comprising:
   a) a process chamber having a cooling cavity;
   b) a transfer chamber cooperatively engaged with the process chamber;
   c) a rotating member, capable of a rotational motion, disposed within the cooling cavity, the rotating member having an upper first surface and a lower second surface;
   d) a motor device for imparting a rotational motion to the rotating member; and
   e) at least one deflection member comprising an end that forms a leading edge disposed in a forward rotational direction adjacent an outer perimeter of the rotating member, wherein the deflection member is disposed between the upper first surface and the lower second surface.

27. A cooling system coupled to a process chamber, comprising:
   a) a cooling cavity;
   b) a rotating member disposed at least partially in the cooling cavity, having an upper first surface, a lower second surface, and at least one magnet disposed between the upper first surface and the lower second surface;
   c) a motor coupled to the rotating member; and
   d) at least one deflection member disposed between the upper first surface and the lower second surface, wherein the deflection member comprises at least one curved portion.

* * * * *

UNITED STATES PATENT AND TRADEMARK OFFICE
CERTIFICATE OF CORRECTION

PATENT NO. : 6,207,026 B1
DATED : March 27, 2001
INVENTOR(S) : Steven Charles Crocker It is certified that error appears in the above-identified patent and that said Letters Patent is hereby corrected as shown below:

Column 2,
Line 61, please replace "tipper" with -- upper --.

Column 9,
Line 49, please insert -- and between at least two magnet pieces -- after "an interior portion of the rotating member".

Signed and Sealed this

Twenty-sixth Day of March, 2002

Attest:

JAMES E. ROGAN
*Attesting Officer*   *Director of the United States Patent and Trademark Office*